United States Patent [19]

Johnson

[11] Patent Number: 5,038,252

[45] Date of Patent: Aug. 6, 1991

[54] PRINTED CIRCUIT BOARDS WITH IMPROVED ELECTRICAL CURRENT CONTROL

[75] Inventor: Lennart B. Johnson, Milford, N.H.

[73] Assignee: Teradyne, Inc., Boston, Mass.

[21] Appl. No.: 302,008

[22] Filed: Jan. 26, 1989

[51] Int. Cl.⁵ .............................................. H05K 1/11
[52] U.S. Cl. .................................... 361/414; 174/251
[58] Field of Search ............. 361/393, 395, 397, 406, 361/412, 400, 404, 408, 414, 417, 419, 420, 426; 439/44, 45, 66, 48, 69, 74; 174/250, 251, 260, 262, 263, 265, 266

[56] References Cited

U.S. PATENT DOCUMENTS 4,787,853 11/1988 Igarashi .
4,859,806 9/1989 Smith ................................ 174/261

Primary Examiner—Leo P. Picard
Assistant Examiner—Donald A. Sparks

[57] ABSTRACT

Printed circuit board with internal laterally extending electrically conductive element and perpendicularly thereto extending conductive element larger at a pin-receiving level than at the laterally extending conductive element level.

5 Claims, 1 Drawing Sheet

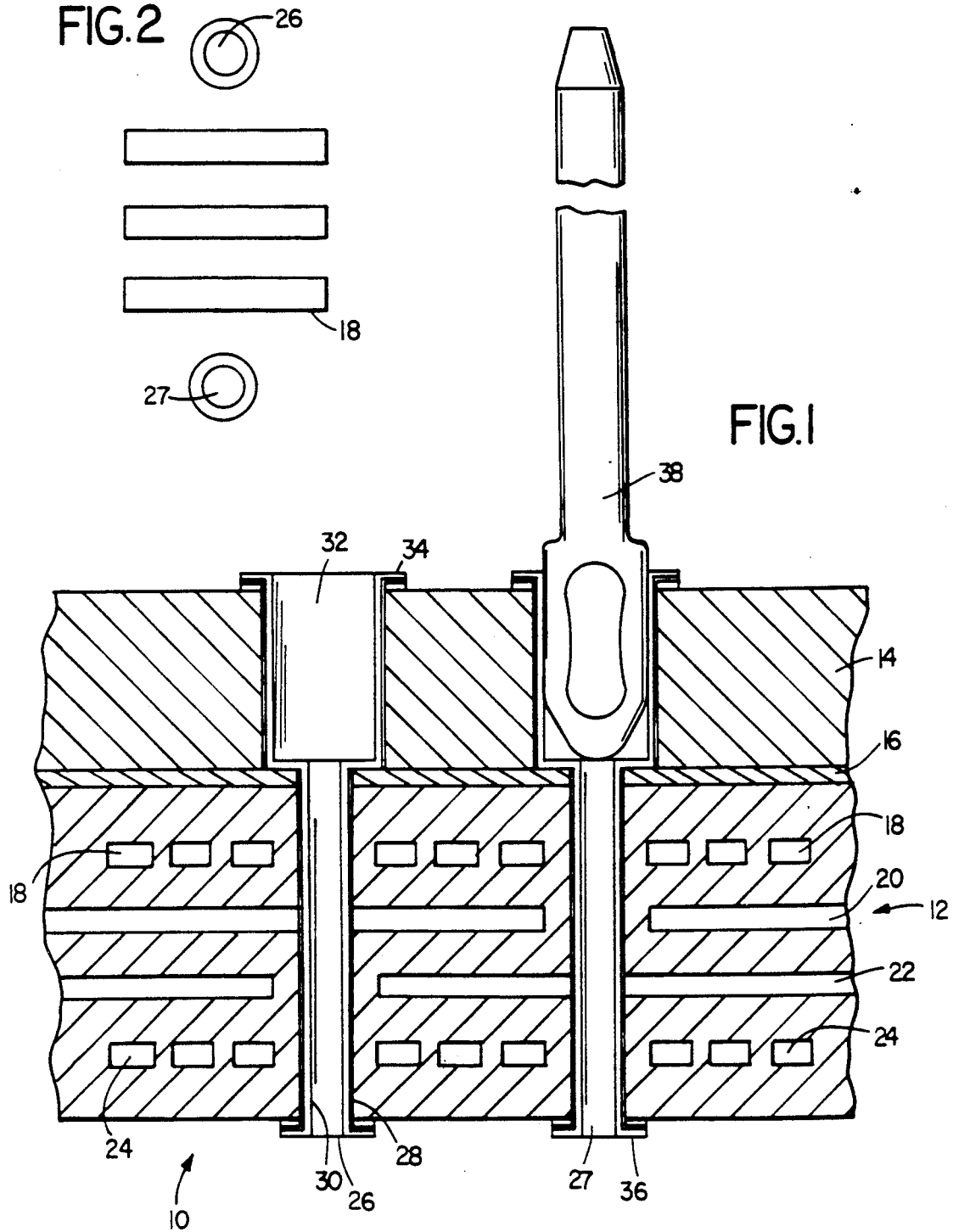

PRINTED CIRCUIT BOARDS WITH IMPROVED ELECTRICAL CURRENT CONTROL

FIELD OF THE INVENTION

This invention relates to printed circuit boards ("PCB"s) which provide for improved electrical current flow control, in and through the PCBs.

BACKGROUND OF THE INVENTION

It is known to use printed circuit boards in which, in a thickness direction therethrough, there are multiple levels of electrical conductors, which have included power layers, ground layers, and layers provided with signal traces, the various layers and traces being in electrical communication with certain contact pins interacting with the PCB and not being in such communication with other such pins, the pins extending all the way through holes in the board of the same diameter throughout board thickness.

It is also known, in PCBs provided with electrically conductive paths only on their two outer surfaces, to provide conductive-surfaced through holes with a larger diameter (in effect counterbores) toward one surface (to accept pins in the counterbores) and with a smaller diameter toward the other surface, to permit increased trace density on that other surface, certain only of the pin-accepting larger holes being through holes at all, the others being blind holes, Igarashi U.S. Pat. No. 4,787,853, "Printed Circuit Board with Through-Hole Connection", granted Nov. 29, 1988.

STATEMENT OF THE INVENTION

It has been found that improved electrical current flow handling is made possible by providing internal conductor paths generally perpendicular to the thickness direction of the PCB and cooperating with internal conductor paths extending generally in the thickness direction of the PCB, the latter paths having outer dimensions smaller than the outer dimension of pin receptacles in communication with the latter paths.

In preferred embodiments, a blind hole in a cap is in communication with a through hole of smaller diameter in a transmission sub-board, lands being provided around both holes at board outer surfaces, and a conductive path being provided through one land, the blind hole, the through hole, and the other land by layers including one of electroless copper and one of electrolytic copper.

PREFERRED EMBODIMENT

The presently preferred embodiment is shown in the drawings, and its structure, manufacture and operation described below.

DRAWINGS

FIG. 1 is a sectional view, broken away and partially diagrammatic, of a printed circuit board according to the invention.

FIG. 2 is a diagrammatic sectional view of a portion of sub-board 12, the section being on a plane extending through traces 18.

STRUCTURE

There is shown in the figures a printed circuit board indicated generally at 10 and which includes a "multilayer" sub-board indicated generally at 12 and a pin-receiving cap 14, "laminated" to the sub-board 12 through prepreg layer 16.

Extending through sub-board 12, which provides the main transmissive portion of this embodiment, are, in a thickness direction, at one level a multiplicity of traces 18, at another a power supply layer 20, at a third a ground layer 22, and at a fourth a multiplicity of traces 24. Power supply layer 20 is electrically connected to hole 26 (0.020" I.D.) through electroless copper layer 28 and electrolytic copper layer 30. Ground layer 22 is similarly connected to hole 27. The traces 18 and 24 are similarly connected to other such (not shown) holes. The layer 30 extends also over the bottom and cylindrical wall of counterbore 32, and provides the outer portions of upper lands 34 and lower lands 36. Counterbores 32 (0.040" I.D.) are provided to accept pins 38, one only of which is shown in position in FIG. 1.

As shown in FIG. 2, three traces 18 extend between holes 26 and 27 (the layers 28 and 30 therearound being shown diagrammatically in FIG. 2 as around each hole a single annulus).

MANUFACTURE

In manufacture of the preferred embodiment the subboard 12 is produced by conventional techniques, laminating plastic (flame retardant epoxy) and conductive layers into a fused unity, with a copper layer underneath. This laminate is then laminated through 0.002" epoxy prepreg layer 16 to cap 14, which at this point has a copper layer thereover. Holes of diameter corresponding to the unplated diameter of holes 26, 27 are then drilled through the overall (second) laminate. Holes of diameter corresponding to unplated counterbore holes 32 are then drilled in cap 14. The entire assembly is then electroless copper plated—over the copper layers of both faces, the entire surfaces of counterbores 32 and holes 26, 27, and the hole surface of prepreg 16. That same assembly area is then plated electrolytically with copper. The outer surfaces are then etched to produce pads around holes 26, 27 and 32, the pads being of a three-layer constituent thickness corresponding to the original copper lamination plus the electroless copper layer plus the final electrolytic copper layer.

Operation

Because the holes in sub-board 12 are of reduced size, a greater number of traces may be placed between any particular pair of holes therein. Also, power and ground layers may have greater effective conductive width.

Other advantages are the need for fewer levels of conductive paths (because more can be done with each level present), reduced capacitance, greater flexibility of trace path design, and practicality of shorter trace paths.

Also, the ability to desirably match impedances to components on the board is improved.

OTHER EMBODIMENTS

Other embodiments will appear to those skilled in the art.

Thus, two caps may be provided, one on each side of the sub-board, to provide for pin acceptance on both sides. Or, some of the smaller holes ("vias") may be blind, so as to eliminate any interference with conductive levels (whether ground, power supply, or signal trace) beneath them.

More traces may be placed between the holes through laterally electrical transmissive portions of the PCB, such as sub-board 12, for example five 5-mil width traces.

What is claimed is:

1. A printed circuit board comprising one or more insulating layers having a top outer surface and a parallel bottom outer surface,
   a pin-receiving conductive element that extends along a first axis generally perpendicular to said top and bottom outer surfaces and extends from one said outer surface toward the other,
   said element having a pin receiving portion at said one surface of a first size,
   said pin receiving portion extending partially along said first axis,
   said element having a second portion extending further along said first axis, said second portion being a size smaller than said first size, and
   one or more second conductive elements that are parallel to said outer surfaces and are generally perpendicular to said first axis and located in a plane intersecting said first axis at said second portion.

2. The board of claim 1 wherein one said insulating layer is a cap and another said insulating layer is a sub-board,
   said pin receiving portion being in said cap, and
   said second portion being in said sub-board.

3. The board of claim 2 further comprising a plurality of said pin receiving conductive elements and a plurality of said second conductive elements.

4. The board of claim 3 wherein each said pin receiving conductive element is a conductive layer over a counterbore in said cap and a connected through-hole in said sub-board.

5. The board of claim 4 wherein said layer comprises sublayers of electrolytic copper and electroless copper.

* * * * *